United States Patent [19]

Nowak

[11] Patent Number: 5,336,637
[45] Date of Patent: Aug. 9, 1994

[54] SILICIDE INTERCONNECTION WITH SCHOTTKY BARRIER DIODE ISOLATION

[75] Inventor: Edward J. Nowak, Essex, Vt.

[73] Assignee: International Business Machines Corporation, Armonk, N.Y.

[21] Appl. No.: 82,139

[22] Filed: Jun. 24, 1993

Related U.S. Application Data

[62] Division of Ser. No. 762,277, Sep. 19, 1991, Pat. No. 5,250,834.

[51] Int. Cl.$^5$ .................. H01L 27/02; H01L 29/80
[52] U.S. Cl. .................. 437/175; 437/39; 437/58; 437/148; 437/931; 148/DIG. 19; 148/DIG. 103
[58] Field of Search ............ 437/39, 57, 58, 147, 437/148, 175, 245, 931, 178, 179; 148/DIG. 19, DIG. 103

[56] References Cited

U.S. PATENT DOCUMENTS

| | | | |
|---|---|---|---|
| Re. 33,209 | 5/1990 | Plummer | 357/23.4 |
| 4,054,893 | 10/1977 | Hutson | 357/15 |
| 4,374,700 | 2/1983 | Scott et al. | 156/656 |
| 4,430,792 | 2/1984 | Temple | 29/571 |
| 4,545,116 | 10/1985 | Lau | 29/591 |
| 4,653,025 | 3/1987 | Minato et al. | 365/154 |
| 4,692,991 | 9/1987 | Flowers | 437/175 |
| 4,785,341 | 11/1988 | Ning et al. | 357/44 |
| 4,871,686 | 10/1989 | Davies | 437/39 |
| 4,896,199 | 1/1990 | Tsuzuki et al. | 357/28 |
| 4,920,388 | 4/1990 | Blanchard et al. | 357/23.4 |
| 4,937,639 | 6/1990 | Yao et al. | 357/23.13 |
| 4,939,567 | 7/1990 | Kenney | 357/42 |
| 4,942,448 | 7/1990 | Tsukamoto et al. | 357/49 |
| 4,980,745 | 12/1990 | Muroga | 357/42 |
| 4,983,544 | 1/1991 | Lu et al. | 437/200 |
| 5,061,981 | 10/1991 | Hall | 357/42 |
| 5,166,094 | 11/1992 | Kapoor | 437/175 |
| 5,225,359 | 7/1993 | DeLong | 437/39 |
| 5,250,834 | 10/1993 | Nowak | 257/350 |

OTHER PUBLICATIONS

Kircher, et al, IBM Technical Disclosure Bulletin, vol. 13, No. 2, Jul. 1970.
Anantha, et al, IBM Technical Disclosure Bulletin, vol. 14, No. 1, Jun. 1971.
Chesbro, et al, IBM Technical Disclosure Bulletin, vol. 27, No. 5, Oct. 1984.
Magdo, et al, IBM Technical Disclosure Bulletin, vol. 14, No. 3, Aug. 1971.
Berger, et al, IBM Technical Disclosure Bulletin, vol. 21, No. 12, May 1979.
Howard, et al, IBM Technical Disclosure Bulletin, vol. 23, No. 7A, Dec. 1980.

Primary Examiner—Olik Chaudhuri
Assistant Examiner—Ken Horton
Attorney, Agent, or Firm—Heslin & Rothenberg

[57] ABSTRACT

In a semiconductor device, an interconnection of differentially doped diffusion regions formed on a substrate includes an interconnecting layer disposed between the two diffusion regions so that the two regions are coupled to one another. The interconnect region is defined by the existing mask boundaries of N+ dopant and P+ dopant regions such that N+ and P+ dopant is not allowed to enter the interconnect region. Thus, the interconnect region is defined without requiring additional masking and etching steps. Once the interconnect region is defined, then the interconnecting layer is formed by a deposition and sintering process. The interconnecting layer provides a schottky barrier and ohmic contact.

3 Claims, 1 Drawing Sheet

SILICIDE INTERCONNECTION WITH SCHOTTKY BARRIER DIODE ISOLATION

This application is a division of application Ser. No. 07/762,277, filed Sep. 19, 1991, now U.S. Pat. No. 5,250,834.

BACKGROUND OF THE INVENTION

1. Technical Field

The present invention relates generally to the field of complementary metal oxide silicon technology, and in particular, to the interconnection of differentially doped diffusion regions.

2. Background Art

In complementary metal oxide silicon (CMOS) technology, the gate electrodes of n-channel and p-channel field effect transistors (FET) are interconnected such that for a given applied voltage, one of the two devices is off. In some CMOS circuits, it is also necessary to interconnect an n-type source/drain diffusion region to a p-type source/drain diffusion region. Conventionally, these diffusion interconnections are accomplished by, for example, using metal wires to connect the regions or by providing an isolation trench to connect the two regions.

U.S. Pat. No. 4,939,567, entitled "Trench Interconnection for CMOS Diffusion Regions," issued on Jul. 3, 1990, and assigned to International Business Machines Corp., describes a conductor filled trench used to couple an n-type diffusion region to a p-type diffusion region. The trench is disposed between a P+ diffusion region and an N+ diffusion region such that a conductive layer within the trench electrically couples the diffusion regions to one another. The conductor is insulated from the substrate by a thin dielectric layer located on the sidewalls and bottom of the trench.

In U.S. Pat. No. 4,983,544, entitled "Silicide Bridge Contact Process," issued on Jan. 8, 1991, and assigned to International Business Machines Corp., a method of forming a bridge contact between a source diffusion region and a conductor filled trench is described. The trench is coupled to a source diffusion region by depositing a layer of refractory metal, such as titanium, on the substrate's surfacer and by sintering to form titanium silicide.

The above-described methods of interconnecting an n-type diffusion region and a p-type diffusion region require the addition of an additional element such as wire to connect the regions or a trench disposed between the regions which then needs to be interconnected to the diffusion regions. These additional elements add to process complexity and expense. Thus, there exists a need to form an interconnection between differentially doped diffusion regions without the use of additional elements. Further, a need exists to form an interconnection between differentially doped diffusion regions without utilizing separate mask and etch steps.

DISCLOSURE OF INVENTION

It is thus an object of the present invention to form a connection between differentially doped regions on a substrate without the use of additional elements, such as wires or trenches.

It is a further object of the present invention to utilize the masks used in defining the P+ doped and N+ doped regions in defining an interconnect region between differentially doped diffusion regions.

It is yet another object of the present invention to provide an interconnection between p-type diffusion regions and n-type diffusion regions without degrading circuit performance.

These objects are achieved, the shortcomings of the prior art are overcome and additional advantages are provided in accordance with the principles of the present invention through the provision of an interconnection region for coupling differentially doped diffusion regions.

In a semiconductor device formed on a substrate of a first conductivity type having a well region therein of a second conductivity type, a first diffusion region of the second conductivity type is formed in the substrate and a second diffusion region of the first conductivity type is formed within the well region. The interconnection region comprises an interconnecting layer disposed between the first diffusion region and the second diffusion region to form an interconnection between those regions. The interconnecting layer forms a schottky barrier diode to the substrate and the well region and an ohmic contact to the first diffusion region and the second diffusion region.

Also, in accordance with the principles of the present invention, the first diffusion region is defined by a first blocking mask and the second diffusion region is defined by a second blocking mask. The combination of these masks is used to define the interconnection region.

BRIEF DESCRIPTION OF DRAWINGS

The subject matter which is regarded as the invention is particularly pointed out and distinctly claimed in the claims at the conclusion of the specification. The invention, however, may best be understood by reference to the following detailed description taken in conjunction with the accompanying drawings in which:

BEST MODE FOR CARRYING OUT THE INVENTION

Figure 1:
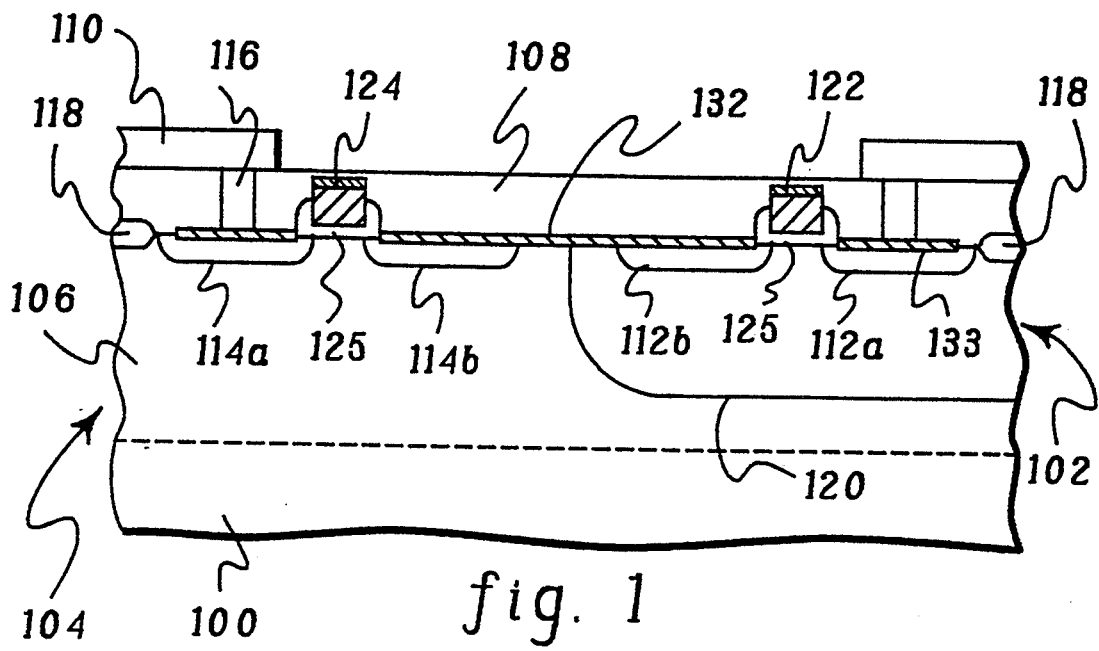
FIG. 1 is a cross-sectional view of a substrate showing the interconnection of the differentially doped diffusion regions in accordance with the principles of the present invention.

FIG. 1 depicts one example of a substrate 100 in which a p-type metal-oxide-silicon field-effect transistor (MOSFET) 102 and an n-type MOSFET 104 is formed thereon. In this particular example, substrate 100 is oriented P+ type monocrystalline silicon and has a p-type epitaxial silicon layer 106 grown upon the substrate. Coated on the substrate in a known manner is a passivation layer 108 which is comprised of an electrically insulating material such as, for example, $SiO_2$ or borophosphosilicate glass. Deposited on passivation layer 108 is a layer of metal 110, e.g., aluminum or tungsten, used to provide contact to source regions 112a, 114a (to be explained further below) through one or more vias 116, which are etched through the passivation layer and are, for instance, filled with a metal such as tungsten.

Figure 2:
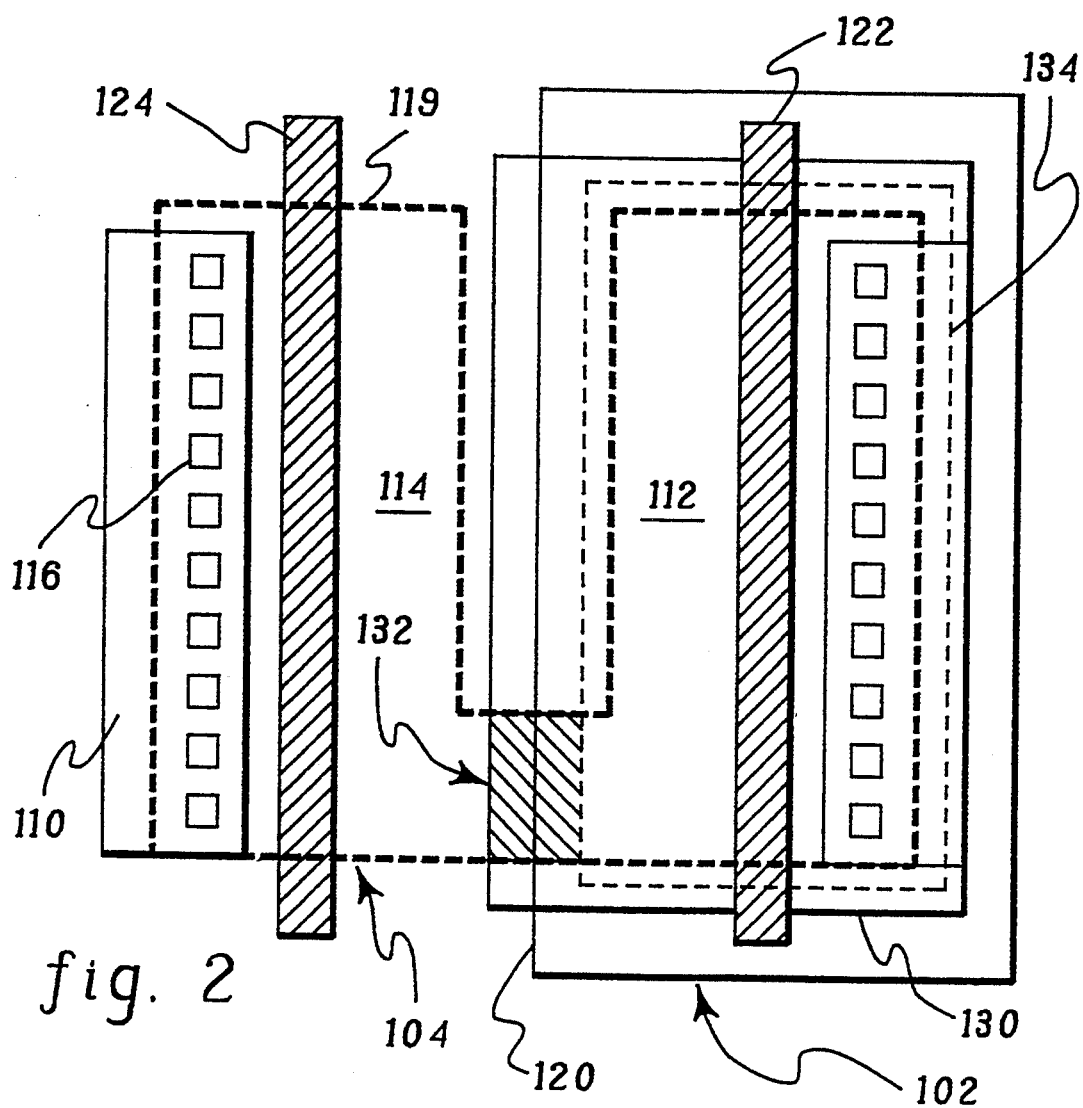
FIG. 2 is a top view of the masks utilized in defining the field isolation, the N+ doped region, P+ doped region and the interconnection region of the present invention.

Also formed on substrate 100 is a field isolation region 118, such as, for example, semi-recessed oxide isolation, which is used to electrically isolate adjacent N+ or P+ diffusion regions. In accordance with the principles of the present invention, field isolation region 118 is defined or patterned by a mask 119, which is depicted in FIG. 2. Referring to FIG. 2, it is shown that mask 119, having for instance a "U" shape, is patterned such that diffusion regions 112 and 114 (described further below) are coupled to one another. This pattern allows selective field isolation outside of mask 119 and permits the opening defined by the mask, i.e., the inside of the "U" shape, to be continuous between the differentially doped regions. Although mask 119 is depicted as a U-shape, it is apparent to those skilled in the art that mask 119 may be of a different shape as long as the intended function is realized. After the above-described masking is accomplished, conventional process steps are used to selectively deposit oxide in the field isolation region defined by the region outside of mask 119.

Referring again to FIG. 1, an n-type well 120 is defined by conventional masking and implantation steps within a portion of epitaxial layer 106. Although a single n-well is shown, dual wells consisting of p-type and n-type wells may, as an alternative, be defined in epitaxial layer 106. Furthermore, in yet another embodiment, a p-well in an n-type epitaxy or an n-type wafer may be used. Residing within n-type well 120 is p-type MOSFET 102. MOSFET 102 includes P+ doped source/drain regions 112a, 112b, respectively, and a gate electrode 122. Similarly, n-type MOSFET 104 includes N+ doped source/drain regions 114a, 114b, respectively, and a gate electrode 124. Gate electrodes 122, 124 are used to control the channel conduction of the respective MOSFETs and are formed of, for example, tungsten or N+ doped polysilicon. The material used to form the gate electrodes may or may not be of the same conducting material disposed on the gate dielectrics 125.

The formation of the source/drain regions is discussed with reference to FIG. 2 in which the mask structures used in defining the diffusion regions and the interconnect region of the present invention (described further below), as well as the field isolation region described above, are depicted. Referring to FIG. 2 and in accordance with the principles of the present invention, an implant blocking mask 130 is used to introduce N+ dopant species such as, for example, phosphorous or arsenic, to the substrate. Mask 130 is located on substrate 100 such that it extends laterally beyond N-well 120 of p-type MOSFET 102. This mask blocks everything inside its boundaries and thus N+ dopant area 114 is located outside of mask 130. It is this mask which defines N+ source/drain diffusion regions 114a, 114b. Further, the boundary definition of the mask is such that in accordance with the principles of the present invention, the n-type dopant is prohibited from entering into an interconnect region 132 (discussed further below).

Similarly, implant blocking mask 134, which is located within N-well 120 is used to introduce P+ dopant species such as, for example, boron or gallium to substrate 100. Mask 134 blocks everything outside of its boundaries and thus P+ dopant area 112 exists within the boundaries of mask 134. That is, P+ source/drain diffusion regions 112a, 112b are formed within N-well 120. This mask definition also advantageously prevents implantation of the P+ dopant into interconnect region 132. Therefore, masks 130, 134 as defined in accordance with the present invention, are utilized in combination to prevent P+ and N+ dopant from entering interconnect region 132. Additionally, the definition of the masks are such that interconnect region 132 necessarily crosses the boundary between N-well 120 and the P-region. These mask definitions or patterns allow the opening in the field isolation defined by isolation mask 119 (described above) to continue into interconnect region 132, thus forming a connection between the differentially doped diffusion regions. For instance, interconnect region 132 couples N+ drain 114b and P+ drain 112b.

As discussed above, the interconnect region between the differentially doped drains is defined by the same masks used to create, for instance, the field isolation region, the P+ dopant and N+ dopant areas. Thus, no additional masking or etching steps are required to define interconnect region 132. The interconnection of the differentially doped drains across interconnect region 132 is provided by a metal which allows for the formation of metal silicide (to be discussed further below) on silicon with schottky barrier characteristics to both the P-silicon and the N-silicon. That is, the interconnection must be such that the silicide potential is within the silicon energy bandgap. In addition to having schottky barrier characteristics, the metal silicide must also have an ohmic contact to the differentially doped diffusion regions. As is known in the art, this means that current is capable of passing to the highly diffused regions from the metal silicide with a negligible voltage drop.

The schottky interconnection provides enhanced immunity to latch-up of CMOS circuits by providing a lower voltage forward-bias conduction path, thereby inhibiting minority carrier injection from the P+ or N+ diffusion regions under such forward-bias conditions. It is necessary to pass current between the two diffusion regions without losing any current to either the N-well or the P-region. This is accomplished since normal use of CMOS circuitry requires that the N-well is the most positive voltage anywhere on the wafer and the P-region is the most negative voltage. Thus, the interconnection is more positive than the P-region and Less positive than the N-well. Therefore, since the voltage is bounded by the P-substrate and the N-we! l, the interconnection does not conduct to those two areas and the interconnection between the differentially doped diffusion regions is isolated through the schottky barrier diode mechanism to both the N-well and the P-substrate. As described, this isolation and interconnection is accomplished without adding additional structure and complexity to the circuit.

As previously mentioned, after interconnect region 132 is defined by the above-described masking steps, the interconnection is formed by depositing a metal such as, for example, titanium on substrate 100. As is known, the titanium is deposited by, for example, sputtering or evaporation under conditions promoting columnar grain growth and sintered (heated to 600°-700° C.) to form a metal silicide layer 133, for instance, titanium silicide. The silicide is formed by the reaction of a refractory metal (e.g., tungsten, titanium, molybdenum, nickel, tantalum, cobalt, etc.) and silicon. The resulting refractory metal silicide produces a characteristic resistance that is much lower than that achieved using conventional metals or doped polysilicon.

In particular, the refractory metal silicide is formed by applying a blanket layer of refractory metal to the substrate and then the substrate is heated. During this heating (or sintering) cycle, silicon diffuses upward from areas in which the refractory metal contacts either the monocrystalline silicon substrate (e.g., diffused source/drain regions 114a, 114b, 112a, 112b and interconnection region 132) or the exposed polycrystalline silicon regions (e.g., the upper surface of the gate electrodes) to form a silicide above these areas. At the same time, although some silicon diffuses upward from those areas in which the refractory metal overlays silicon oxide (e.g., silicon oxide isolation structures as well as silicon oxide spacers that are formed on the sidewalls of the gate electrode), the diffusion rate is slow enough so that typically no silicide is formed in these regions during the sintering cycle. After the sintering cycle is completed, the structure is exposed to an etchant (typically a wet etchant) that preferentially attacks the unreacted refractory metal without appreciably attacking the reacted silicide. The end product of this process, sometimes referred to as "salicide," includes: regions of silicide that are aligned to and in contact with the source/drain regions (to thus lower the contact resistance) and the gate electrode (to thus lower the gate sheet resistance) of the FET, without the use of separate mask-and-etch steps to selectively provide silicide in these areas. In addition, in accordance with the principles of the present invention, the regions of silicide are also aligned to and in contact with the interconnect region, without the use of separate mask-and-etch steps to selectively provide silicide in this region.

As described above, interconnect region 132 is defined between differentially doped diffusion regions by utilizing the mask steps required to form the field isolation region and the N+ and P+ dopant regions and the interconnection is provided by depositing a metal such as titanium under conditions promoting columnar grain growth and sintered to form a metal silicide such as titanium silicide. As described previously, the metal must be one which allows formation of metal silicide on silicon with schottky barrier characteristics to both the P- silicon and N- silicon and an ohmic contact to the differentially doped diffusion regions. The interconnections provide a sub-surface coupling, i.e. coupling below passivation level 108, between differentially doped diffusion regions while maintaining electrical isolation to the P- and N-regions in which the diffused areas are imbedded. This eliminates the need to couple the diffusions through the use of a wire layer, thus increasing the density of the resulting integrated circuits.

Although a preferred embodiment has been depicted and described in detail herein, it will be apparent to those skilled in the relevant art that various modifications, additions, substitutions and the like can be made without departing from the spirit of the invention, and these are therefore considered to be within the scope of the invention as defined by the appended claims.

What is claimed is:

1. A method of forming a semiconductor device comprising the steps of:
   providing a substrate of a first conductivity type having a well region therein of a second conductivity type;
   creating in said substrate a first diffusion region of said second conductivity type, said first diffusion region being defined by a first blocking mask;
   creating in said well region a second diffusion region of said first conductivity type, said second diffusion region being defined by a second blocking mask;
   using said first mask and said second mask in combination to define an interconnect region, said interconnect region coupling said first diffusion region and said second diffusion region;
   forming an interconnecting layer in said interconnect region, said interconnecting layer forming a schottky barrier diode to said substrate and said well region and an ohmic contact to said first diffusion region and said second diffusion region.

2. The method of forming a semiconductor device as recited in claim 1, further including defining a field isolation region with a field isolation mask, said isolation mask being patterned such that said first diffusion region and said second diffusion region are coupled.

3. The method of forming a semiconductor device as recited in claim 2, wherein said first blocking mask blocks everything inside boundaries of said first mask such that said first diffusion region is located outside of said first blocking mask, said second blocking mask blocks everything outside of boundaries of said second mask such that said second diffusion region exists within the boundaries of said second ask, and said field isolation mask allows selective field isolation outside of said isolation mask.

* * * * *

UNITED STATES PATENT AND TRADEMARK OFFICE
CERTIFICATE OF CORRECTION

PATENT NO. : 5,336,637
DATED : August 09, 1994
INVENTOR(S) : Edward J. Nowak

It is certified that error appears in the above-indentified patent and that said Letters Patent is hereby corrected as shown below:

In the Claims: Column 6, line 41, delete "ask" and replace with --mask--

Signed and Sealed this

Sixth Day of December, 1994

Attest:

BRUCE LEHMAN

*Attesting Officer*  *Commissioner of Patents and Trademarks*